United States Patent [19]
Flietner et al.

[11] Patent Number: 6,124,206
[45] Date of Patent: *Sep. 26, 2000

[54] REDUCED PAD EROSION

[75] Inventors: Bertrand Flietner, Hopewell Junction, N.Y.; Robert Ploessl, Glen Allen, Vt.; Monika Gschoederer, Wappingers Falls, N.Y.

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/998,856

[22] Filed: Dec. 29, 1997

[51] Int. Cl.⁷ .................. H01L 21/302; H01L 21/461
[52] U.S. Cl. .................. 438/692; 438/700; 438/706
[58] Field of Search .................. 438/712, 717, 438/736, 738, 703, 735, 692

[56] References Cited

U.S. PATENT DOCUMENTS

| | | | |
|---|---|---|---|
| 4,135,954 | 1/1979 | Chang et al. | 438/736 |
| 4,201,800 | 5/1980 | Alcorn et al. | 438/717 |
| 4,543,707 | 10/1985 | Ito et al. | 438/738 |
| 5,118,384 | 6/1992 | Harmon et al. | 438/712 |
| 5,300,463 | 4/1994 | Cathey et al. | 438/703 |
| 5,413,678 | 5/1995 | Hossain | 438/757 |
| 5,413,966 | 5/1995 | Schoenborn | 438/717 |
| 5,686,345 | 11/1997 | Harmon et al. | 438/717 |

*Primary Examiner*—Benjamin L. Utech
*Assistant Examiner*—Duy-Vu Deo
*Attorney, Agent, or Firm*—Stanton C. Braden

[57] ABSTRACT

An improved hard mask is provided to reduced pad erosion during semiconductor fabrication. The hard mask includes an etch stop layer between first and second hard mask layers.

14 Claims, 6 Drawing Sheets

REDUCED PAD EROSION

FIELD OF THE INVENTION

The invention relates to semiconductor fabrication in general and, more particularly, to the reduction of pad film erosion.

BACKGROUND OF THE INVENTION

In the fabrication of integrated circuits (ICs) or chips, features are created by etching into the silicon substrate that may or may not include one or more device layers. These features are used to form devices or portions of devices. One type of feature such as a deep trench (DT), for example, is used to form a trench capacitor of a memory cell. Typically, in the process for forming a random access memory (RAM) integrated circuit (IC) or chip, an array of deep trenches are etched in the array region of the substrate. Trench capacitors are then formed from the trenches. Such trench capacitors are used to create an array of memory cells, which are interconnected by word-lines and bit-lines to form a memory IC.

FIGS. 1a–d show a portion of a process for forming the array of trench capacitors. As shown in FIG. 1a, a conventional pad stack 110 is formed on the surface of a substrate 101. The pad stack includes, for example, sequential layers of a pad oxide 112 and a pad nitride 114. Above the pad stack is a hard mask layer 116 comprising, for example, TEOS. The hard mask layer serves as a hard mask used to form the DTs. A layer of photoresist (not shown) is deposited over the hard mask and patterned to selectively expose areas within the array region where the DTs are to be formed. The substrate is then etched by a reactive ion etch (RIE), forming the DTs.

The RIE erodes the hard mask layer at a greater rate in the array region 135 than the non-array (field) region 130, resulting in a large step between the field and array regions. Subsequently, at least after formation of a node dielectric, the trenches are filled with, for example, heavily doped polysilicon (poly) 150. Since the poly is conformal, the topography created during RIE is transferred the poly layer as well.

In FIG. 1b, a chemical mechanical polish (CMP) is performed to provide a planar surface. The CMP is selective to the hard mask layer, removing the poly without effectively removing the hard mask. As can be seen, the CMP erodes the poly in the array region, causing a depression to form therein. This is referred to as dishing. Due to the large step that exists, poly residuals remain at the edges 160 of the array after CMP. After stripping the hard mask layer as shown in FIG. 1c, poly "ears" 165 protrude above the pad nitride layer in the DTs. Because of the poly residuals remaining in the edges during the previous CMP step as a result of the topography, the ears at the array edges are higher than the ears in the middle or plateau portion 162. For example, the height of ears at the edges can be>than about 2500A and the height of the ears in the plateau car range from about 0 to 1500A.

A touch up CMP is required to remove the poly ears. However, as shown in FIG. 1d, the touch up CMP causes erosion of the pad nitride layer in the array region. Further, the pad nitride erosion is more pronounced at the edge than at the plateau portion of the array region. Such erosion causes variations in gate threshold voltage and, in some designs, increases buried strap resistance, adversely affect yield.

As apparent from the foregoing discussion, it is desirable to provide an improved pad stack for use in etching DTs.

SUMMARY OF THE INVENTION

The invention relates to fabrication of integrated circuits. In particular, the invention provides an improved technique for forming deep trenches.

DETAILED DESCRIPTION OF THE INVENTION

The invention relates to the fabrication of ICs. Typically, a plurality of ICs are processed in parallel on a semiconductor substrate such as a silicon wafer. Other types of semiconductor wafers are also useful. The wafer is diced after forming the ICs, separating them into individual chips. The chips are then packaged and integrated into, for example, consumer products. Such consumer products include, for example, personal computers, cellular phones, and other electronic products.

For purposes of discussion, the invention is described in the context of forming a portion of a chip. In particular, the invention is described in the context of forming trench capacitors employed in memory cells such as DRAM cells. However, the invention is applicable to the fabrication of ICs in general, including random access memories (RAMs), dynamic RAMs (DRAMs), synchronous DRAMs (SDRAMs), and static RAMs (SRAMs). Other ICs include logic devices such as programmable logic arrays, application specific ICs (ASICs), and merged logic-DRAMs (embedded DRAMs).

Figure 2:
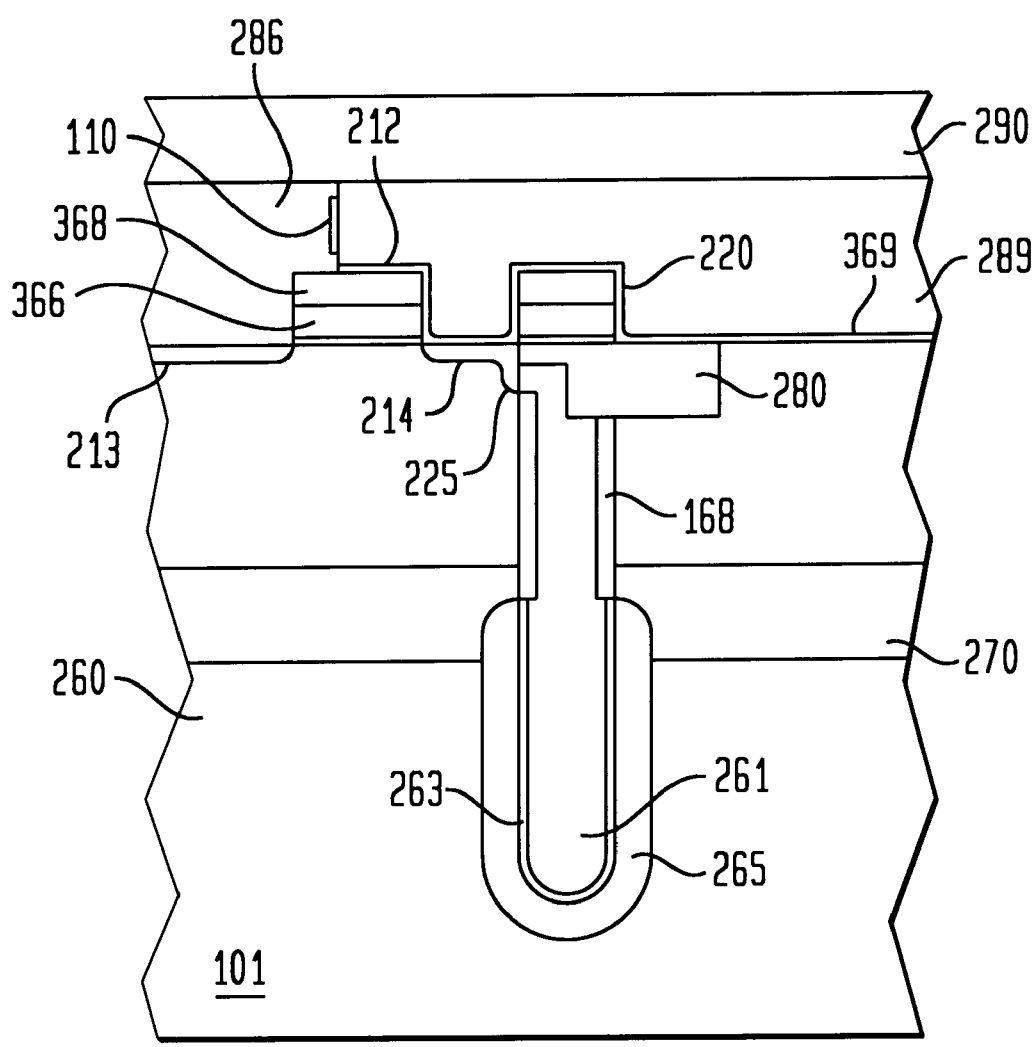
FIG. 2 shows a trench capacitor DRAM cell.

Referring to FIG. 2, a trench capacitor DRAM cell is shown. Such DRAM cell is described in, for example, Nesbit et al., A 0.6 $\mu m_2$ 256 Mb Trench DRAM Cell With Self-Aligned Buried Strap (BEST), IEDM 93-627, which is herein incorporated by reference for all purposes. As shown, the DRAM cell includes a trench capacitor 260 formed in a substrate 101. The trench is filled with, typically, polysilicon (poly) 261 that is heavily doped with n-dopants. The poly, which serves as an electrode of the capacitor, is referred to as a "storage node." Optionally, a buried plate 265 doped with n-type dopants surrounds the Lower portion of the trench. The buried plate forms the second electrode of the capacitor. In the upper portion of the trench is a collar 168 for reducing parasitic leakage. A node dielectric 263 separates the two plates of the capacitor. A buried well 270 comprising n-type dopants is provided to connect the buried plates of the DRAM cells in the array. Above the buried well is a p-well 273. The p-well serves to reduce vertical leakage.

The DRAM cell also comprises a transistor 110. The transistor includes a gate 212 and diffusion regions 213 and 214 comprising n-type dopants. The diffusion regions are referred to as the source and drain. The designation of source and drain depends on the operation of the transistor. Connection of the transistor to the capacitor is achieved via a diffusion region 225, referred to as the "node diffusion". The gate, also referred to as the "wordline," typically comprises poly 366 and nitride 368 layers. Alternatively, layer 357 is a polycide layer which comprises silicide, such as molybdenum ($MoSi_x$), tantalum ($TiSi_x$), tungsen ($WSi_x$), titanium ($TiSi_x$), or cobalt ($CoSi_x$), over a layer of poly to reduce wordline resistance.

In one embodiment, the polycide layer comprises $Wsi_x$ over poly. A nitride liner 369 covers the gate stack and substrate. The nitride layer 368 and nitride liner serves as an etch or polish stop layer for subsequent processing.

A shallow trench isolation (STI) 280 is provided to isolate the DRAM cell from other cells or devices. As shown, a wordline 220 is formed over the trench and isolated therefrom by the STI. Wordline 220 is referred to as the "passing wordline". Such configuration is referred to as a folded bitline architecture. Other configurations such as open or open-folded bitline architectures or cell designs are also useful.

An interlevel dielectric layer 289 is formed over the wordlines. A conductive layer, representing a bitline, is formed over the interlevel dielectric layer. A bitline contact opening 286 is provided in the interlevel dielectric layer to contact the source 213 to the bitline 290.

A plurality of such cells is configured in an array. The array of cells is interconnected by wordlines and bit-lines. Access to a cell is achieved by activating the cell' corresponding wordline and bitline.

FIGS. 3a–h show a process of forming an array of trench capacitors. A substrate is provided in which the trench capacitors are formed. The substrate, for example, is a silicon wafer. Other semiconductor substrates such as gallium arsenide, germanium, silicon on insulator (SOI), or other semiconductor materials are also useful. The substrate, for example, may be lightly or heavily doped with dopants of a predetermined conductivity to achieve the desired electrical characteristics.

Figure 1A:
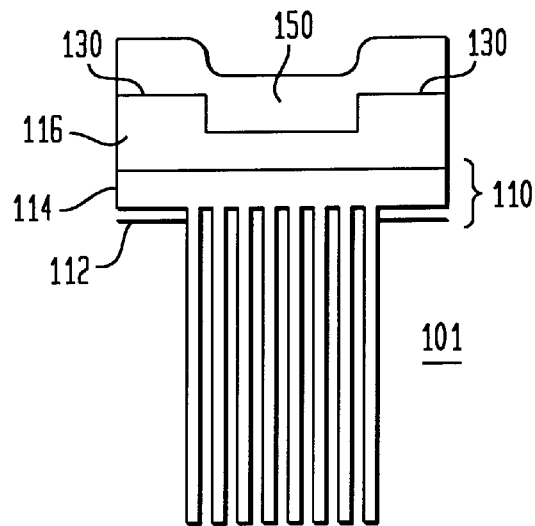
FIGS. 1a–d show a conventional process of forming deep trenches.
Figure 1C:
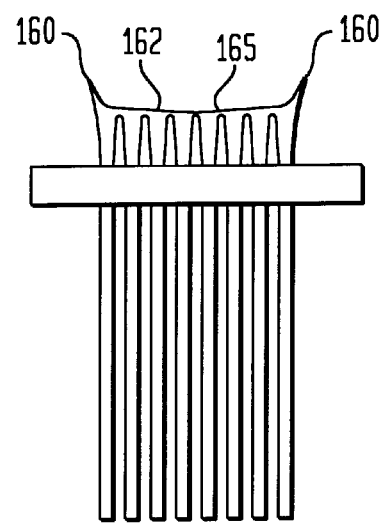
Figure 1B:
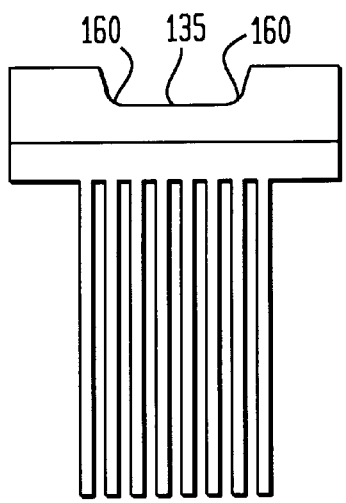
Figure 1D:
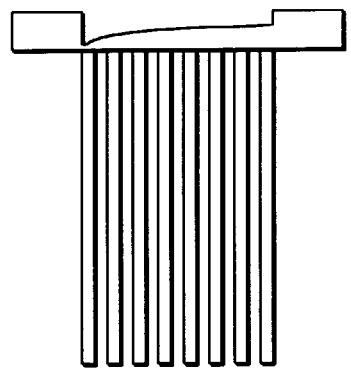

A pad stack layer 310 is formed on the surface of the substrate. The pad stack 310, for example, is a conventional pad stack such one described in FIGS. 1a. As shown, the pad stack includes a pad oxide layer 312 and a pad stop layer 314. The pad oxide is formed on the surface of the surface of the substrate using known techniques such as thermal oxidation. The pad oxide is sufficiently thick to reduce stress and promote adhesion between the pad stop layer with the substrate. Typical thickness of the pad oxide layer is about 10 nm.

Above the pad oxide is the pad stop layer. The pad stop layer comprises material having sufficient selectivity to the material used to fill the trenches. In one embodiment, the pad etch stop layer comprises silicon nitride ($Si_3N_4$) due to its relatively low etch rate to the polysilicon used to fill the trenches. Typically, the etch selectivity between the poly and etch stop layers is about 60:1. For polishing, the selectivity is about 300:1. The nitride layer is formed by, for example, low pressure chemical vapor deposition (LPCVD). Other techniques for depositing the nitride layer are also useful. Typically, the pad nitride layer is about 200–220 nm.

Above the pad nitride is formed a hard mask layer 315. In accordance with the invention, the hard mask layer comprises an etch stop 318 between first and second hard mask layers 316 and 320. The first and second hard mask layers comprise a material that is sufficiently dense or hard to withstand the ion bombardments of the RIE during the formation of deep trenches. Further, the etch mask should have a higher wet etch rate than that of the pad etch stop layer. Typically, the selectivity is greater than about 80. In one embodiment, the hard mask layers comprise undoped silicate glass such as TEOS. Other appropriate hard mask materials, such as boron doped silicate glass (BSG) or flowable oxide, are also useful. Further, it is also understood that it is not necessary that the first and second hard mask layers are formed with the same material. By providing an etch stop layer between first and second mask layers, the topography created during DT etch is not reflected in subsequent processing, thereby improving yield.

Figure 3A:
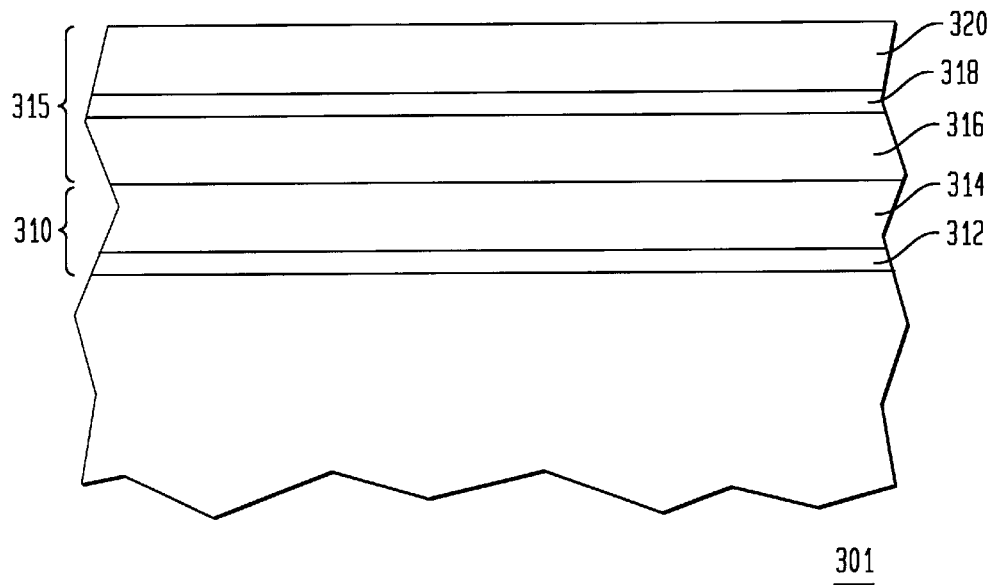
FIGS. 3a–h show a process of forming deep trenches in accordance with one embodiment of the invention.
Figure 3B:
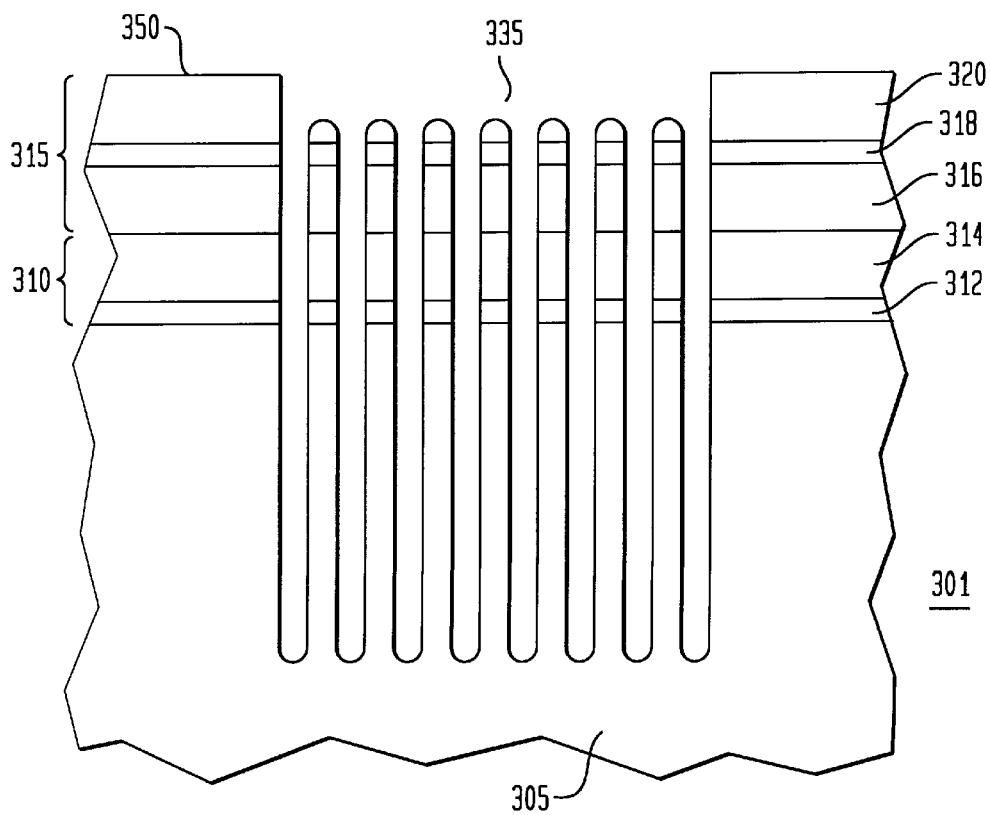

Referring to FIG. 3b, the gate stack is patterned using conventional lithographic techniques. Such techniques include depositing a photoresist layer over the pad stack, thereby selectively exposing it with an exposure source and mask. Depending on whether a positive or negative resist is used, either the exposed or unexposed portions of the resist layer are removed during development, leaving regions of pad stack unprotected. The unprotected regions correspond to areas where trenches are to be formed.

An etch, such as a reactive ion etch (RIE) is performed to create openings in the pad stack in regions unprotected by the resist. The openings expose the substrate below. The RIE continues to etch the substrate to create the DTs 305. The RIE erodes the second mask layer 320 in the array region 335 at a greater rate than in the field region 330, creating an uneven topography there between. Since the second mask layer is sufficiently thick, the etch stop layer 318 is not exposed. Typical thickness of the second mask layer is about 200–220 nm. The actual thickness may vary depending on, for example, the RIE process and/or depth of the DTs that are formed.

Optionally, diffusion regions surrounding the lower portion of the trenches are formed, serving as buried plates. Formation of the buried plates is achieved by various known techniques, such as providing a source from which dopants diffuse into the substrate. The node dielectric of the capacitors is then formed in the trenches.

Figure 3C:
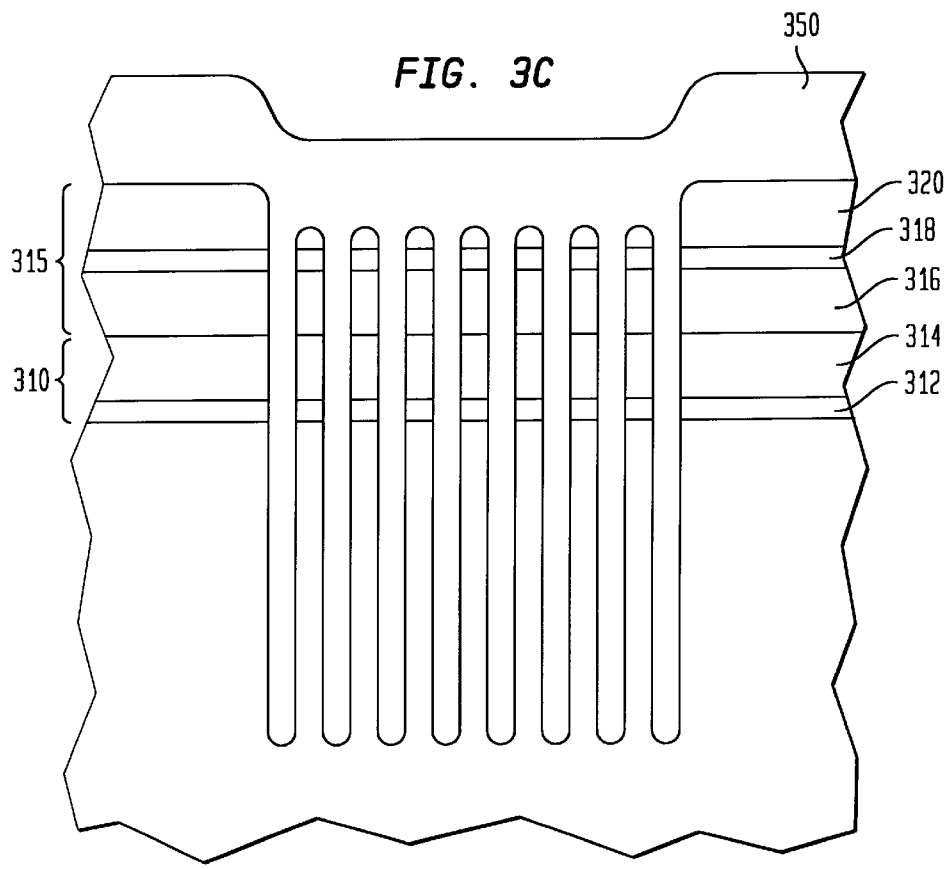

Referring to FIG. 3c, poly 350 is deposited to fill the DTs. The poly overfills the trenches to ensure complete filling. The poly overfill results in excess poly that covers the surface of the substrate. Since poly is conformal, the underlying topography is reflected in the deposited layer. As such, the surface of the poly includes a depression over the array region 335.

Figure 3D:
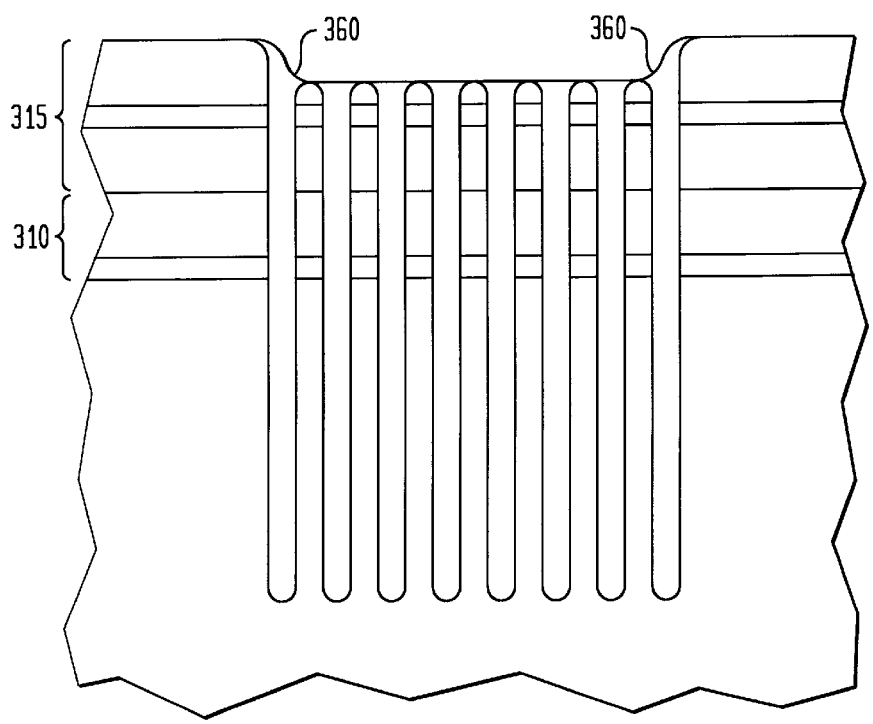

Referring to FIG. 3d, the excess poly is polished by, for example, CMP. The CMP is selective to the second mask layer. Due to the large step that exists between array and field regions, poly residuals remain at the edges 360 of the array after CMP.

Figure 3E:
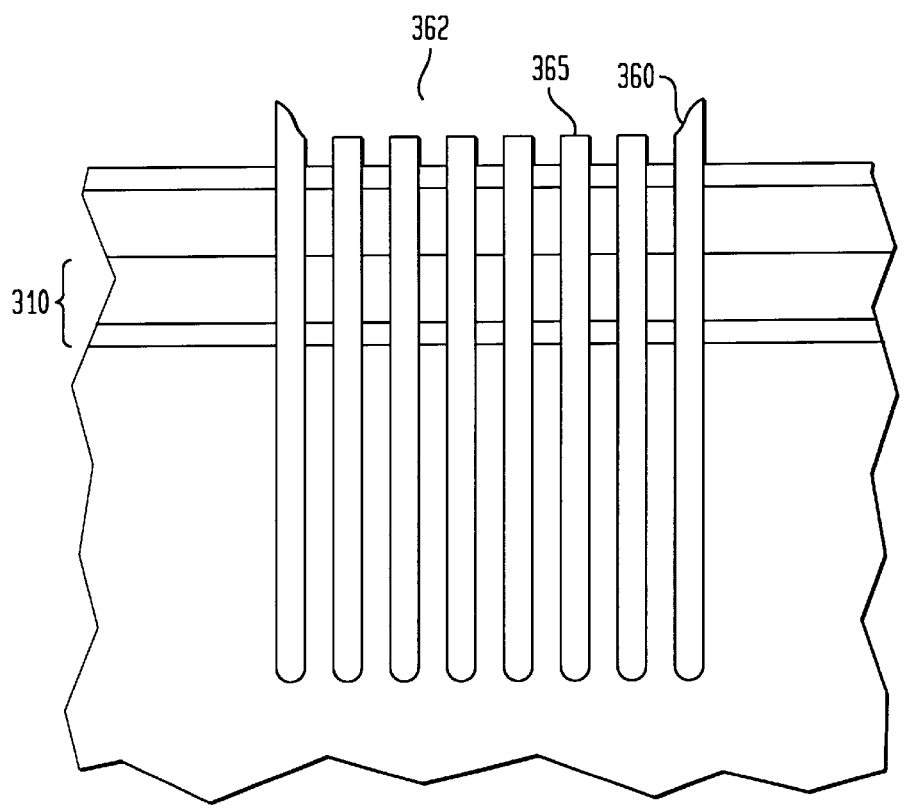

In FIG. 3e, the second mask is removed selective to the poly and second etch stop layer. This is typically achieved with a wet etch. As shown, removal of the second pad mask leaves poly "ears" 365 protruding above the pad nitride layer in the DTs. Because of the poly residuals remaining in the edge during the previous CME, step as a result of the topography, the height of the ears at the array edges 360 are higher than those in the middle or plateau portion 362.

Figure 3F:
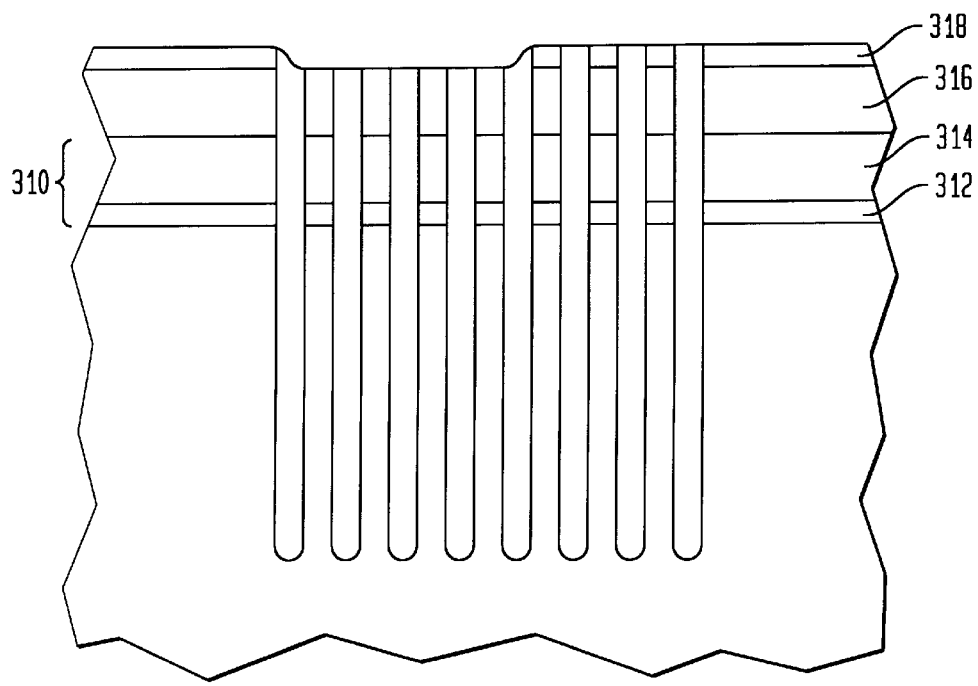

Referring to FIG. 3f, the surface of the substrate is polished by, for example, CMP. The purpose of the CMP is to remove the poly ears. The CMP is selective to the etch stop layer 318, resulting in a relatively planar top surface 370. The etch stop layer is sufficiently thick to serve as a CMP etch stop layer. Typical thickness of the etch stop layer is about 20 nm.

The CMP may erode a portion of the etch stop layer, as shown, in the array region. However, the first mask layer 316 is sufficiently thick to protect the pad stop layer 314 from being exposed. The thickness of the first mask layer is about, for example, 200–220 nm. The first mask layer, however, may vary in thickness depending on the CMP performance.

Figure 3G:
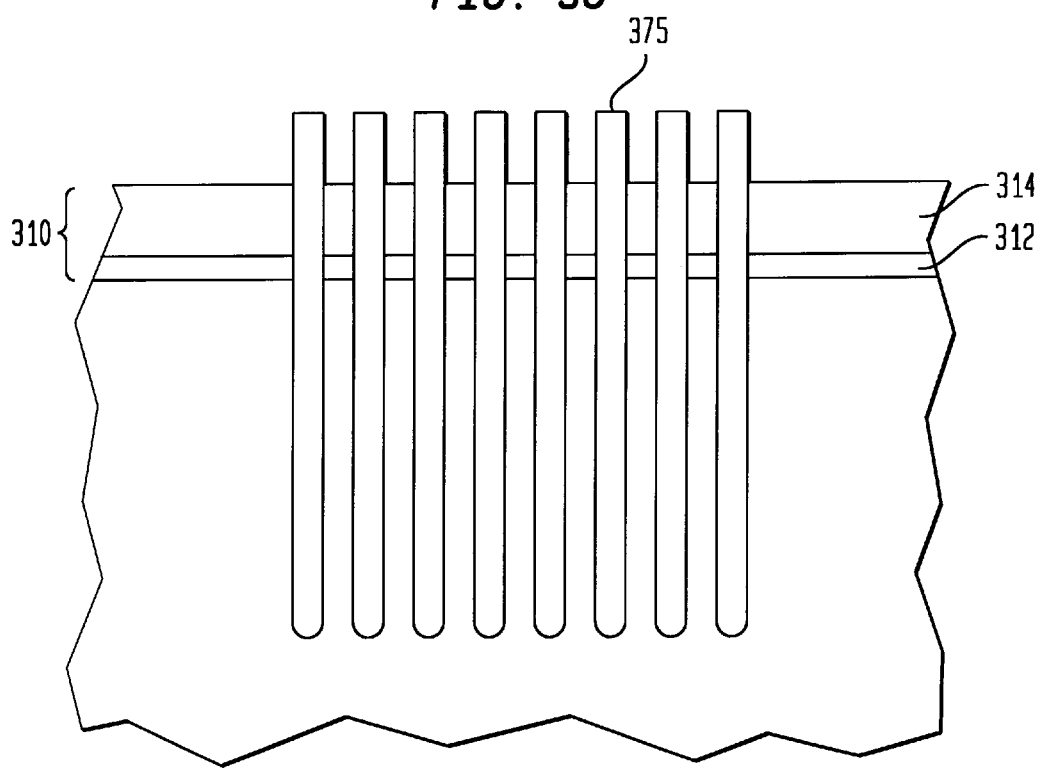

Referring to FIG. 3g, the etch stop and first mask layers are removed. Removal of the etch stop layer is achieved by, for example, a wet etch. A wet etch is also used to remove the first hard mask, selective to the stop layer 314 and poly. Poly ears are thereby left above the stop layer 314. As shown, the poly ears are relatively equal in height.

Figure 3H:
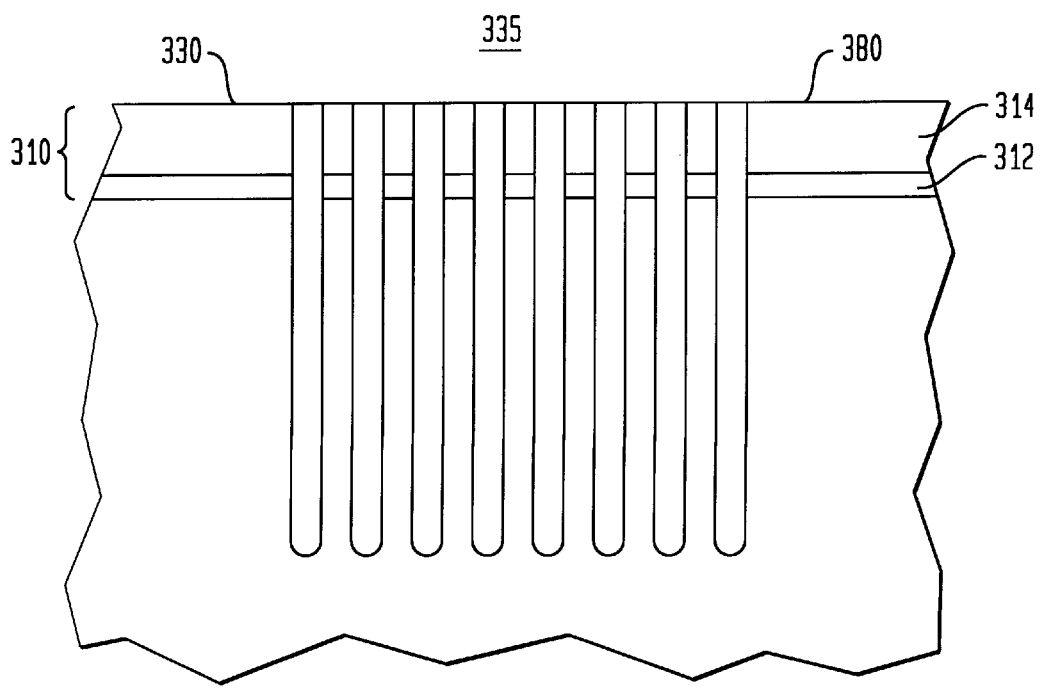

The poly ears are removed with a CMP using the pad stop layer as a polish stop. As shown in FIG. 3*h*, the CMP results in a substantially planar surface 380. Due to the fact that the poly ears were relatively equal in height, the CMP does not excessively erode the etch stop layer in the array region. Thus, the mask layer as provided by the invention reduces the adverse effects of the topography created by the DT etch.

At this point, an etch such as an RIE is performed to recess the poly in the trenches. A collar is then formed by depositing and patterning, for example, a dielectric layer. After the formation of the collar, the remaining portion of the DRAM is fabricated using conventional techniques, such as those described in Nesbit et al., A 0.6 $\mu m^2$ 256 Mb Trench DRAM Cell With Self-Aligned Buried Strap (BEST), IEDM 93-627, which is already herein incorporated by reference for all purposes. This includes, for example, filling the trenches, forming buried straps, defining isolation regions to form the STIs, depositing the various layers comprising the gate stack and patterning these layers to form the gate conductors that represent wordlines, depositing an interlevel dielectric layer, creating contact openings, and forming bit-lines.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

What is claimed is:

1. A method for providing a substantially planar pad stack after trench formation and filling comprising the steps of:
   providing a substrate;
   forming a pad stack on the substrate;
   forming a hard mask above the pad stack, wherein the hard mask comprises an etch stop layer between first and second hard mask layers;
   etching through the hard mask and the pad stack to form the trenches in the substrate;
   filling the trenches with polysilicon;
   removing the first hard mask layer selective to the polysilicon and the etch stop layer such that polysilicon protrusions remain above the etch stop layer;
   polishing the polysilicon protrusions to provide a substantially planar surface on the etch stop layer;
   removing the etch stop layer and the second hard mask layer permitting the polysilicon protrusions to extend above the pad stack layer; and
   polishing the polysilicon protrusions to provide a substantially planar surface on the pad stack layer.

2. The method as recited in claim 1, wherein the step of forming a hard mask above the pad stack includes the steps of:
   forming the first hard mask layer;
   forming the etch stop layer on the first hard mask layer; and
   forming the second hard mask layer on the etch stop layer from a material which is selectively removable relative to the etch stop layer.

3. The method as recited in claim 1, wherein the first and second hard masks are selectively removable relative to polysilicon.

4. The method as recited in claim 1, wherein the first and second hard masks include a silicon glass.

5. The method as recited in claim 1, wherein the first and second hard masks include different materials.

6. The method as recited in claim 1, wherein the hard mask includes a selectivity of about 80 to 1 or greater relative to the pad stack.

7. The method as recited in claim 1, wherein the first and second hard masks include the same material.

8. A method for providing a substantially planar pad stack after trench formation and filling comprising the steps of:
   providing a substrate;
   forming a pad stack on the substrate;
   forming a hard mask above the pad stack, wherein the hard mask comprises an etch stop layer between first and second hard mask layers;
   patterning a resist on the second hard mask layer to locate positions for trenches;
   etching through the hard mask layer and the pad stack layer to form trenches in the substrate corresponding to the positions for trenches;
   depositing polysilicon in trenches and removing the polysilicon down to the first hard mask layer;
   removing the first hard mask layer selective to the polysilicon and the etch stop layer;
   removing protrusions of polysilicon selective to the etch stop layer to provide a substantially planar top surface on the etch stop layer;
   removing the etch stop layer and the second hard mask layer; and
   polishing the polysilicon down to the pad stack such that the pad stack remains substantially planar surface across the trenches and surrounding regions.

9. The method as recited in claim 8, wherein the step of removing the etch stop layer and the second hard mask layer includes removing the etch stop layer and the second hard mask layer selective to the polysilicon to provide the substantially planar surface on the pad stack.

10. The method as recited in claim 8, wherein the step of forming a hard mask above the pad stack includes the steps of:
    forming the first hard mask layer;
    forming the etch stop layer on the first hard mask layer; and
    forming the second hard mask layer on the etch stop layer from a material which is selectively removable relative to the etch stop layer.

11. The method as recited in claim 8, wherein the first and second hard masks include a silicon glass.

12. The method as recited in claim 8, wherein the first and second hard masks include different materials.

13. The method as recited in claim 8, wherein the hard mask includes a selectivity of about 80 to 1 or greater relative to the pad stack.

14. The method as recited in claim 8, wherein the first and second hard masks include the same material.

* * * * *